United States Patent
Chung

(10) Patent No.: US 7,459,929 B2
(45) Date of Patent: Dec. 2, 2008

(54) SEMICONDUCTOR INTEGRATED CIRCUIT DEVICE AND ON-DIE TERMINATION CIRCUIT

(75) Inventor: In-Young Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 11/075,470

(22) Filed: Mar. 8, 2005

(65) Prior Publication Data

US 2005/0212552 A1  Sep. 29, 2005

(30) Foreign Application Priority Data

Mar. 29, 2004  (KR) ............... 10-2004-0021330

(51) Int. Cl.
*H03K 17/16* (2006.01)
*H03K 19/003* (2006.01)

(52) U.S. Cl. .......................... 326/30; 326/81
(58) Field of Classification Search ............ 326/30, 326/80–83, 112, 119, 121, 86–87, 68, 63
See application file for complete search history.

(56) References Cited

U.S. PATENT DOCUMENTS

| 5,399,920 A * | 3/1995 | Van Tran ............... 326/83 |
| 5,831,467 A | 11/1998 | Leung et al. |
| 5,952,847 A * | 9/1999 | Plants et al. ............ 326/80 |
| 6,426,658 B1 * | 7/2002 | Mueller et al. .......... 327/112 |
| 6,538,951 B1 * | 3/2003 | Janzen et al. ........ 365/230.03 |
| 6,919,743 B2 * | 7/2005 | Tobita ................. 327/108 |
| 6,940,333 B2 * | 9/2005 | Chiu et al. ............. 327/333 |
| 6,970,369 B2 * | 11/2005 | Funaba et al. ........... 365/63 |
| 7,092,299 B2 * | 8/2006 | Kwak et al. ............ 365/198 |
| 2004/0228196 A1 * | 11/2004 | Kwak et al. ........ 365/230.03 |

FOREIGN PATENT DOCUMENTS

| JP | 08-335871 | 12/1996 |
| JP | 09-018326 | 1/1997 |
| KR | 2003-0083237 | 10/2003 |

OTHER PUBLICATIONS

English language abstract of Japanese Publication No. 08-335871.
English language abstract of Japanese Publication No. 09-018326.
English language abstract of Korean Publication No. 2003-0083237.

* cited by examiner

*Primary Examiner*—James H. Cho
*Assistant Examiner*—Jason Crawford
(74) *Attorney, Agent, or Firm*—Marger Johnson & McCollom, P.C.

(57) ABSTRACT

The present invention discloses a semiconductor integrated circuit device and an on-die termination circuit. The circuit includes a level shifter for boosting an on-die termination control signal to a high voltage level; and a first NMOS transistor connected between a power voltage and a pad and terminating the pad to a first termination voltage level in response to the high voltage level. The on-die termination circuit has a reduced input capacitance.

4 Claims, 4 Drawing Sheets

SEMICONDUCTOR INTEGRATED CIRCUIT DEVICE AND ON-DIE TERMINATION CIRCUIT

CROSS-REFERENCE TO RELATED APPLICATION

This application claims the benefit of Korean Patent Application No. 2004-21330, filed on Mar. 29, 2004. The entire disclosure of Korean Patent Application No. 2004-21330 is hereby incorporated herein by reference.

BACKGROUND OF THE INVENTION

1. Field of the Invention

The present invention relates to a semiconductor integrated circuit device and, more particularly, to an on-die termination circuit for a semiconductor integrated circuit device.

2. Description of the Related Art

Lines used to transmit signals among different integrated circuit (IC) devices (e.g., microprocessor, memory controller, memory, etc) are often terminated by a termination circuit to prevent signals from being reflected.

Signal reflection degrades signal integrity, and particularly as at higher system operating speeds, signal reflection can have a significant effect on signal integrity. In general, in order to prevent the maximum amount of signal reflection, a termination circuit is installed on a signal line close to an IC device.

Generally, a termination circuit includes a termination resistor and a termination voltage. The circuit is generally positioned on a board at the end of a signal line which transmits signals between IC devices. However, when there are a large number of signal lines on a board, it can be hard to position the termination circuit on the board. A technique has been developed that does not terminate signals on the board. Instead the signals are terminated in the IC circuit which is mounted on the board. The technique is called an on-die termination technique.

FIG. 1 shows a circuit diagram of a conventional on-die termination circuit. The on-die termination circuit shown in FIG. 1 includes a PMOS transistor P, an NMOS transistor N, an inverter I, a first termination resistor R1, and a second termination resistor R2. In FIG. 1, "ODT_EN" denotes a control signal that is on-die terminated. Pad 10 represents an input pad in the IC device, and "VDDQ" represents a power voltage.

The on-die termination circuit of FIG. 1 operates as follows: When the on-die termination control signal ODT_EN has a low level signal applied, the inverter I outputs a signal with a high level. Therefore, a signal that has a low level is applied to a gate of the NMOS transistor N and a signal that has a high level is applied to a gate of the PMOS transistor P, so that both the NMOS transistor N and the PMOS transistor P are turned off. In this state the on-die termination circuit does not operate.

When the on-die termination control signal ODT_EN has a high level signal applied, the inverter I outputs a signal that has a low level. Therefore, a signal that has a high level is applied to a gate of the NMOS transistor N, and a signal that has a low level is applied to a gate of the PMOS transistor P. In this state both the NMOS transistor N and the PMOS transistor P are turned on, and a signal applied to the pad 10 is terminated to a predetermined termination voltage level. The termination voltage level has a value between a power voltage VDDQ and a ground voltage. If the first termination resistor R1 and the second termination resistor R2 have the same resistance value, the magnitude of the terminating voltage is the magnitude of the power voltage divided by two.

In other words, the on-die termination circuit of FIG. 1 obtains a desired resistance value using the two termination resistors R1 and R2 which are connected in parallel. The NMOS transistor N and the PMOS transistor P are used to obtain a resistance value that is smaller than resistance values of either of the termination resistors R1 and R2. A high value signal ODT_EN operates the on-die termination circuit to terminate the signal with a predetermined termination voltage. When a low value ODT_EN signal is applied, the on-die termination circuit does not operate.

The size of the transistors can be increased to reduce the resistance value of the transistors. However, when the size of a transistor is increased, the capacitance of the transistor is also increased. When the capacitance of the transistor increases, the input capacitance of the on-die termination circuit also increases. Furthermore, the PMOS transistor should have 2.5 to 3 times the width of the NMOS transistor in order to have the same resistance value as the NMOS transistor, and thus, the capacitance of the PMOS transistor is similarly increased. Accordingly, the on-die termination circuit of FIG. 1 has disadvantages associated with the capacitance of the PMOS transistor.

In addition, the electrical characteristics of the NMOS transistor and PMOS transistor may be different due to differences in the manufacturing process. If the electrical characteristics of the NMOS transistor and the PMOS transistor are different, a signal applied through the pad 10 may be distorted.

SUMMARY OF THE INVENTION

The present invention provides, among other things, a semiconductor integrated circuit (IC) device and an on-die termination circuit which can minimize signal distortion and reduce input capacitance.

The present invention also provides an on-die termination circuit that includes a level shifter for boosting the on-die termination control signal to a high voltage level; and a first NMOS transistor connected between a power voltage and a pad. The NMOS transistor is controlled by the high voltage level control signal whereby the pad is terminated to a first termination voltage level in response to the high voltage level control signal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and the invention should not be construed as limited to the embodiments set forth herein.

Figure 2:
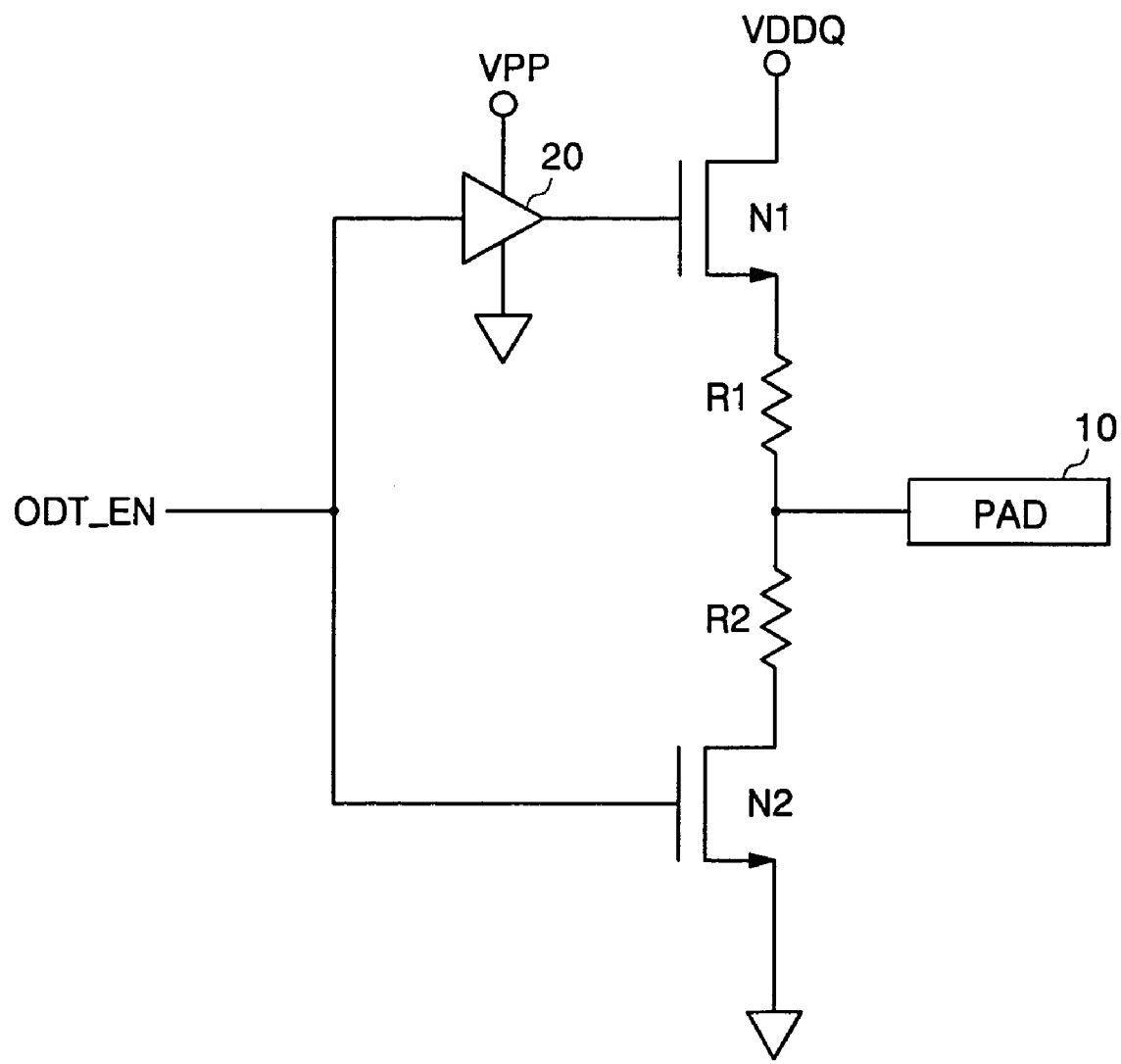
FIG. 2 is a circuit diagram illustrating an on-die termination circuit according to an embodiment of the present invention.

FIG. 2 is a circuit diagram illustrating an embodiment of the present invention. The circuit shown in FIG. is an on-die termination circuit. The circuit includes a first NMOS transistor NI connected to a power voltage VDDQ, a second NMOS transistor N2 connected to a ground voltage, a first termination resistor R1, a second termination resistor R2, and a level shifter 20.

Figure 1:
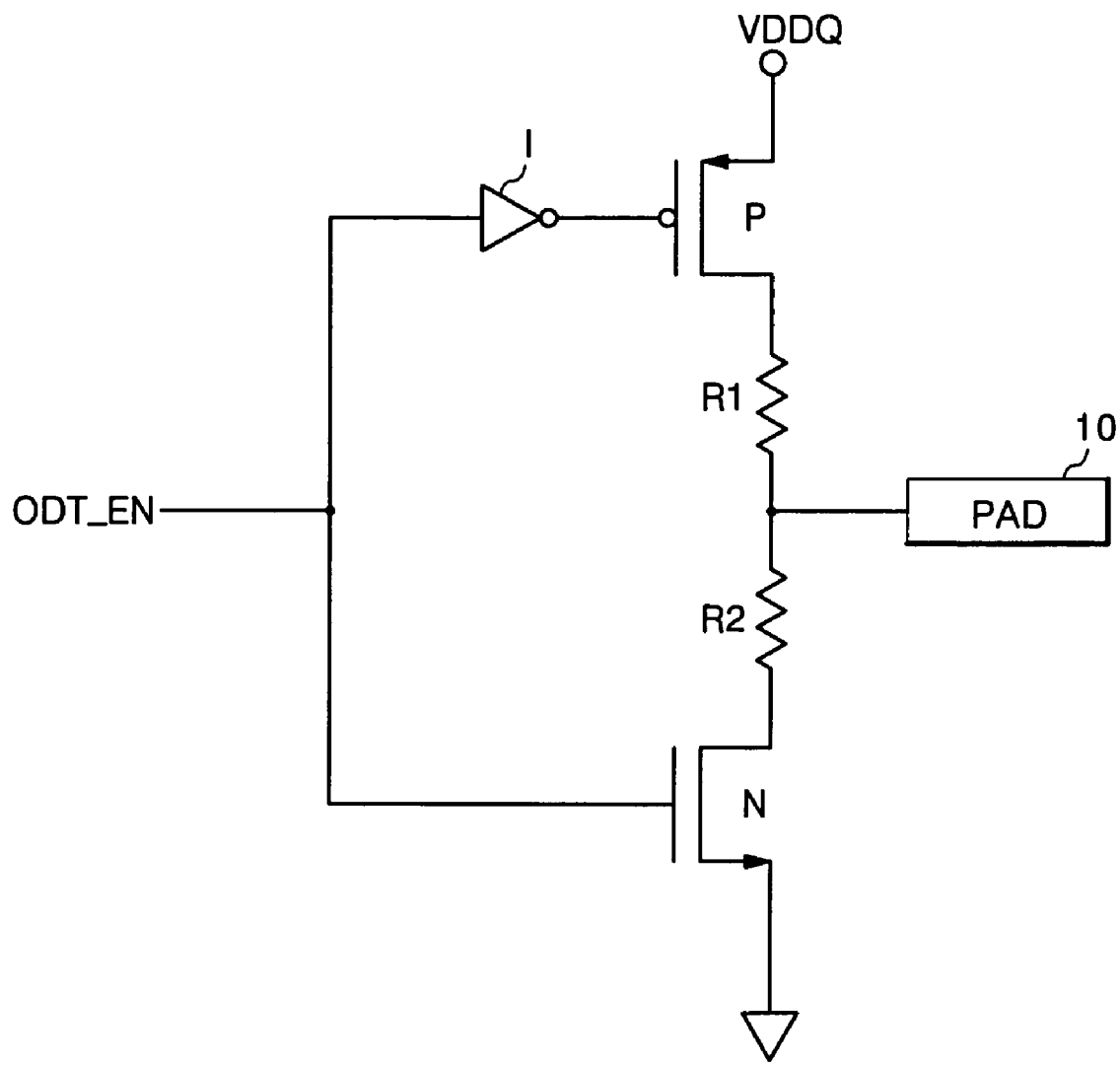
FIG. 1 is a circuit diagram illustrating a prior art on-die termination circuit.

The circuit shown in FIG. 2 performs substantially the same overall function as does the circuit shown in FIG. 1. However, the on-die termination circuit shown in FIG. 2 replaces the PMOS transistor P that is included in the circuit shown in FIG. 1 with the NMOS transistor N1. Additionally the circuit shown in FIG. 2 includes a level shifter 20.

The circuit receives an on-die termination control signal "ODT_EN". The circuit includes a power voltage source "VDDQ", a relatively high voltage source "VPP", and an input pad 10. The pad 10 is connected to signal lines on a board (not shown in the figure). The connections between the circuit shown in FIG. 2 and other components on an integrated circuit are explained later with respect to FIG. 4.

The functions of the various components in the circuit shown in FIG. 2 are as follows: The level shifter 20 boosts the level of the on-die termination control signal ODT_EN to a high voltage VPP level. The output of circuit 20 is applied to the gate of the first NMOS transistor N1. Since the power voltage VDDQ is applied to the drain of the first NMOS transistor N1, a voltage which is sufficiently higher than the power voltage VDDQ must be applied to the gate of transistor N1 in order to turn on the first NMOS transistor N1. Thus, voltage VPP is higher than voltage level VDDQ. The first NMOS transistor N1 is controlled by the control signal ODT_EN which has been boosted to a high level by the level shifter 20. The first NMOS transistor N1 terminates signals applied through the pad 10 to a first termination voltage level in response to output signal from the level shifter 20.

The on-die termination circuit of FIG. 2 operates as follows: When the on-die termination control signal ODT_EN has a low level, low level signals are applied to both the gate of the first NMOS transistor N1 and the gate of the second NMOS transistor N2, and both the first NMOS transistor N1 and the second NMOS transistor N2 are turned off. Under these conditions the circuit does not operate and no on-die termination operation is performed.

When an on-die termination control signal ODT_EN has a high level, a high voltage VPP level generated by the level shifter 20 is applied to the gate of the first NMOS transistor N1, and the high level control signal is applied to the gate of the second NMOS transistor N2. Thus, both of the first NMOS transistor N1 and the second NMOS transistor N2 are turned on, and a signal applied to the pad 10 is terminated to a predetermined termination voltage level. If the first termination resistor R1 and the second termination resistor R2 have the same value, the predetermined termination voltage is equal to the power voltage VDDQ divided by two.

While the on-die termination circuit of FIG. 2 performs the same overall operation as the conventional on-die termination circuit of FIG. 1, the input capacitance of the on-die termination circuit is reduced significantly by using a NMOS transistor instead of the PMOS transistor. The NMOS transistor has one third (⅓) the width of a PMOS transistor having the same resistance value. Therefore, the capacitance of the transistor is reduced. Also, the source voltage of the NMOS transistor N1 connected to a power voltage VDDQ side operates at the power voltage VDDQ, and thus the capacitance of the transistor is even further reduced. Consequently, the input capacitance of the on-die termination circuit shown in FIG. 2 has a significantly smaller value than that of the conventional on-die termination circuit.

Also, a conventional on-die termination circuit is configured such that the PMOS transistor operates a power voltage side and the NMOS transistor operates at a ground voltage, thus two transistors have different electrical characteristics. The on-die termination circuit of the present invention is configured such that the two NMOS transistors are connected to a power voltage and to a ground voltage, and thus the electrical characteristics of the two transistors are almost same. Accordingly, signal distortion that can result from different electrical characteristics of the two transistors can be prevented.

FIG. 2 shows a circuit that includes two NMOS transistors N1 and N2 and two termination resistors R1 and R2. However, the on-die termination circuit can be configured using just the first NMOS transistor N1 and the first termination resistor R1 arranged at a power voltage VDDQ. In this case, a predetermined first termination voltage can be applied instead of a power voltage VDDQ.

Figure 3:
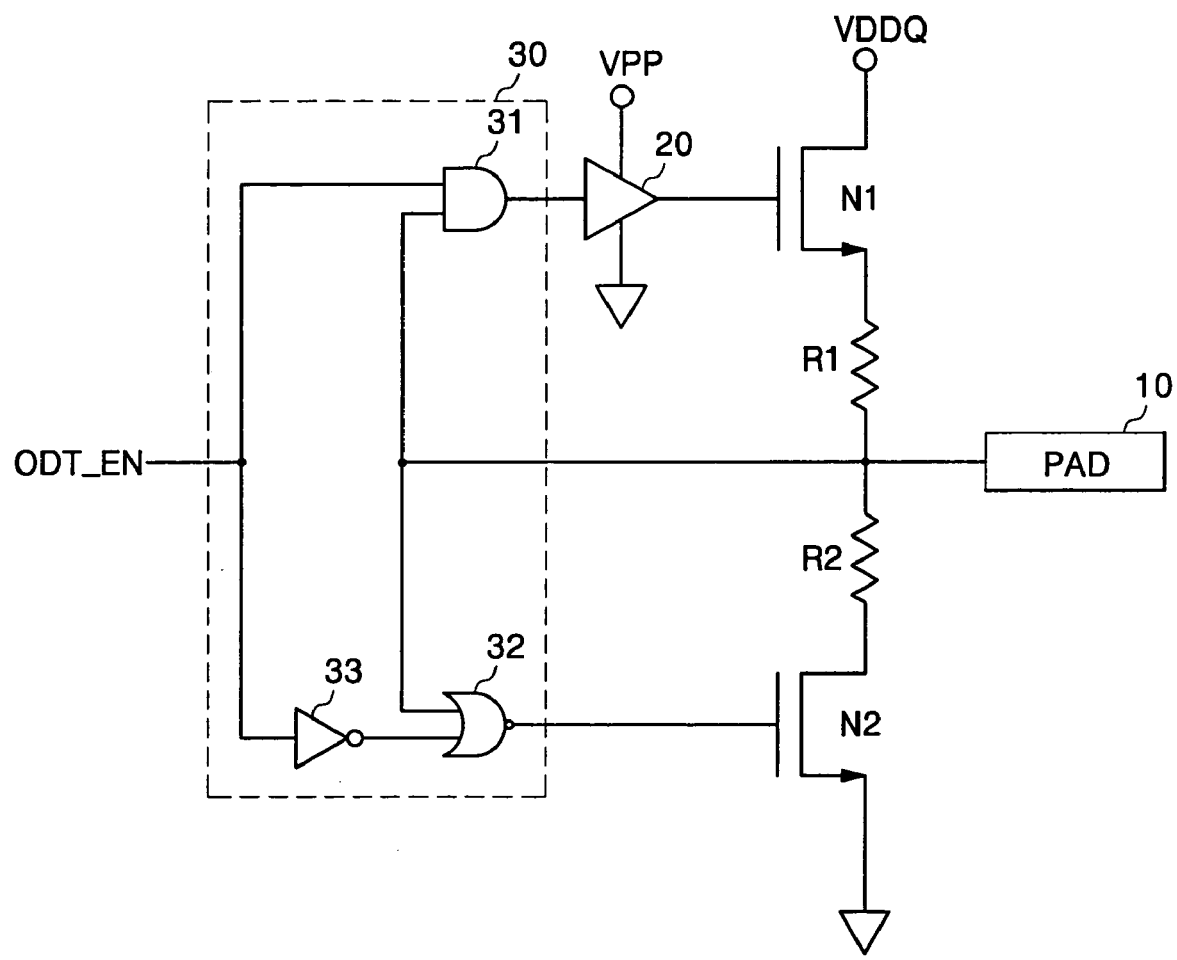
FIG. 3 is a circuit diagram illustrating an on-die termination circuit according to another embodiment of the present invention.

FIG. 3 shows another embodiment of the present invention. The on-die termination circuit of FIG. 3 includes a logic circuit 30 in addition to the circuit shown in FIG. 2. The logic circuit 30 includes an AND gate 31, a NOR gate 32, and an inverter 33.

The logic circuit 30 outputs different control signals to the level shifter 20 and the second NMOS transistor N2 in response to control signal ODT_EN and to a signal applied through the pad 10.

The level shifter 20 boosts the control signal received from the logic circuit 30 to a high voltage level and outputs the signal to the gate of the first NMOS transistor N1. The first NMOS transistor N1 terminates a signal applied from the pad 10 to a first termination voltage level in response to a signal from the level shifter 20. The second NMOS transistor N2 terminates the signal applied from the pad 10 to a second termination voltage level in response to an output signal of the logic circuit 30.

Operation of the on-die termination circuit of FIG. 3 is explained below. If an on-die termination control signal ODT_EN has a low level, the inverter 33 outputs a high level signal, and thus the AND gate 31 and the NOR gate 32 output are at a low level. As a result, signals of a low level are applied to both the gates of the first NMOS transistor N1 and the second NMOS transistor N2, and thus the first NMOS transistor N1 and the second NMOS transistor N2 are turned off, whereby an on-die does not operate.

If an on-die termination control signal ODT_EN has a high level, the inverter 33 outputs a signal of a low level. If a signal applied through the pad 10 has a high level, the AND gate 31 outputs a high level signal, and the NOR gate 32 outputs a signal of a low level. The high level signal outputted from the AND gate 31 is boosted to a high voltage VPP level by the level shifter 20. Thus, a signal having a high voltage VPP level is applied to the gate of the first NMOS transistor N1, whereas a signal of a low level is applied to the gate of the second NMOS transistor N2. As a result, the first NMOS transistor N1 is turned on, and the second NMOS transistor N2 is turned off. In this situation the signal applied through the pad 10 is terminated to a first termination voltage, i.e., a power voltage VDDQ level.

If an on-die termination control signal ODT_EN has a high level and a signal applied through the pad 10 has a low level, the AND gate 31 outputs a low level signal, and the NOR gate 32 outputs a high level signal. Thus, a low level signal is applied to the gate of the first NMOS transistor N1, and a signal having a high level is applied to the gate of the second NMOS transistor N2. As a result, the first NMOS transistor N1 is turned off, and the second NMOS transistor N2 is turned on. In this situation the signal applied through the pad 10 is terminated to a second termination voltage, i.e., a ground voltage level.

The on-die termination circuit of FIG. 3 does not perform an on-die termination operation when an on-die termination control signal ODT_EN has a low level. In the situation where the on-die termination control signal ODT-EN has a high level, the on-die termination circuit terminates the signal applied through the pad 10 to a power voltage VDDQ level if a signal applied through the pad 10 has a high level, and terminates the signal applied through the pad 10 to a ground voltage level if a signal applied through the pad 10 has a low level.

In another embodiment of the present invention, unlike the conventional on-die termination circuit which employs the PMOS transistor at a power voltage VDDQ side, an input capacitance of the on-die termination circuit can be reduced by using the NMOS transistor. Also, since the NMOS transistors are arranged at both a power voltage VDDQ side and a ground voltage side, the transistor connected to a power voltage VDDQ and the transistor connected to a ground voltage are almost same in electrical characteristics, thereby preventing distortion of signals applied through the pad 10.

FIGS. 2 and 3 have showed that a power voltage is applied to a drain of the first NMOS transistors N1. However, a specific termination voltage can be applied to the drain of the first NMOS transistor N1 instead of a power voltage VDDQ. Also, it has been explained above that a signal applied to the gate of the first NMOS transistor N1 is boosted to a high voltage VPP level. However, the signal applied to the gate of the first NMOS transistor N1 can be boosted to a voltage higher than a power voltage VDDQ or termination voltage.

Figure 4:
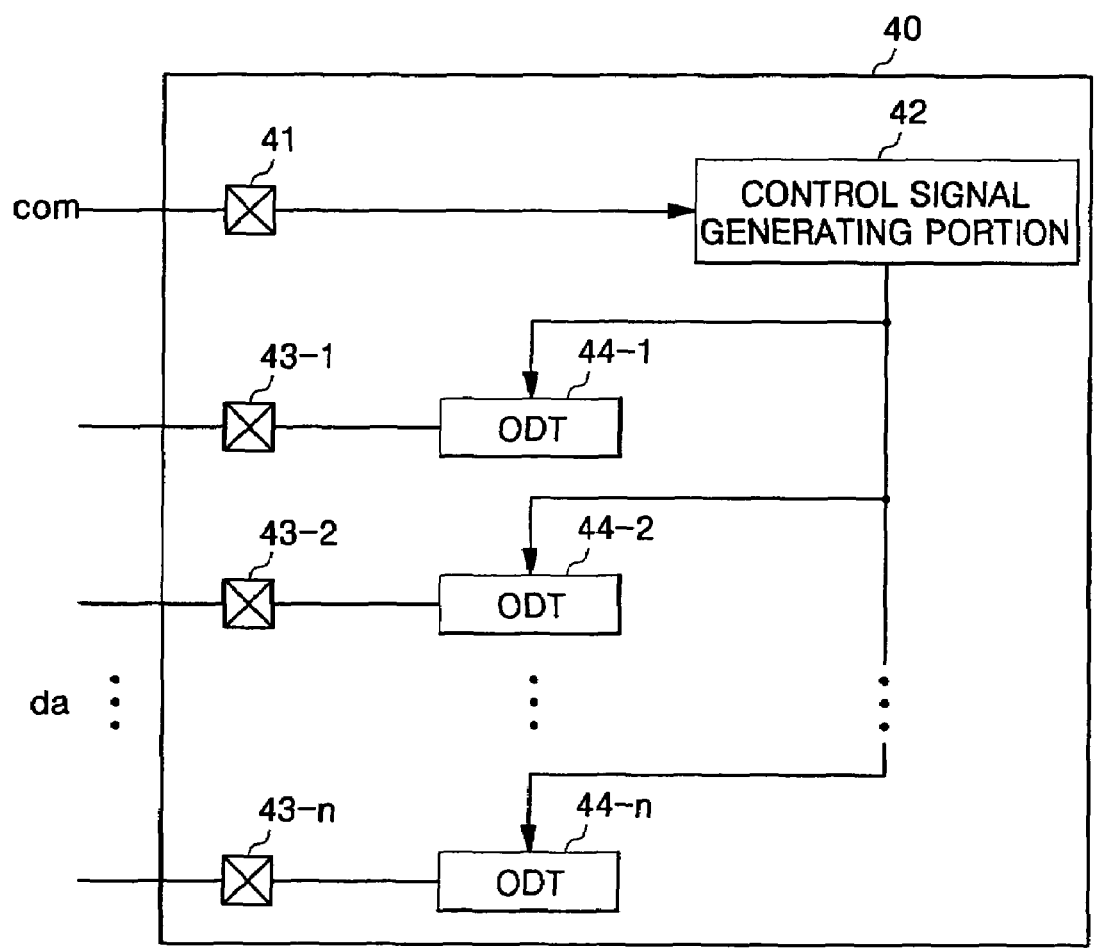
FIG. 4 is a block diagram illustrating a semiconductor memory device that includes an on-die termination circuit according to still another embodiment of the present invention.

FIG. 4 is a block diagram illustrating a semiconductor memory device including an on-die termination circuit according to still another embodiment of the present invention. The semiconductor memory device of FIG. 4 includes a command pad 41, a control signal generating portion 42, a plurality of data input pads 43-1 to 43-n, and a plurality of on-die termination circuits 44-1 to 44-n.

In FIG. 4, the input line labeled "com" is a line that transmits a command signal outputted from a memory controller (not shown), and the inputs labeled "da" transmit data signals outputted by the memory controller.

The functions of the various components of the semiconductor memory device of FIG. 4 are as follows: The semiconductor memory device 40 performs a read operation or a write operation in response to the command com outputted from the memory controller. The control signal generating portion 42 outputs a read signal, a write signal, and an on-die termination control signal in response to a command inputted through the command pad 41. The on-die termination circuits 44-1 to 44-n operate in response to an on-die termination control signal outputted from the control signal generating portion 42, and terminate data signals da inputted through the data input pads 43-1 to 43-n to a predetermined termination voltage level.

In other words, the control signal generating portion 42 outputs an on-die termination control signal having a high level in response to a command outputted from the memory controller in order to terminate the data signals, i.e., to write a data onto the semiconductor memory device. The on-die termination circuits 44-1 to 44-n terminate the data signals da inputted through the data input pads 43-1 to 43-n to a certain termination voltage level when an on-die termination control signal having a high level is applied. As described above, the on-die termination circuits 44-1 to 44-n of the semiconductor memory device can be configured by using only NMOS transistors, and thus the input capacitance of the on-die termination circuits 44-1 to 44-n can be reduced. Also, the electrical characteristics of the two transistors respectively connected coupled to a power voltage and a ground voltage become almost same by arranging the NMOS transistors at both a power voltage side and a ground voltage side, thereby preventing a distortion of a signal applied through the pad.

In FIG. 4, the semiconductor memory device has been explained as an embodiment of the present invention, but the on-die termination circuit of the present invention can be applied to other semiconductor IC devices with a function of receiving data.

As described herein before, the on-die termination circuit of the semiconductor integrated circuit device according to the present invention can reduce an input capacitance of the transistor, and also can prevent a distortion of a signal applied through the pad of the semiconductor IC device.

While the invention has been shown and described with respect to various embodiments thereof, it should be understand that various other changes in detail can be made without departing from the spirit and scope of the invention. The invention is limited only by the appended claims.

What is claimed is:

1. An on-die termination circuit responsive to an on-die termination control signal, the circuit comprising:
   an input pad;
   a level shifter for boosting the on-die termination control signal to a high voltage level control signal;
   a power voltage;
   a first NMOS transistor connected between the power voltage and the input pad and being activated by the high voltage level control signal; and
   a second NMOS transistor connected between a ground voltage and the input pad and being activated by the on-die termination control signal,
   wherein the input pad is terminated to a particular termination voltage level when the first NMOS transistor and the second NMOS transistor are simultaneously activated.

2. The circuit of claim 1 wherein the first NMOS transistor has a source, the second NMOS transistor has a drain, and the circuit further comprises,
   a first termination resistor connected between the source of the first NMOS transistor and the input pad; and
   a second termination resistor connected between the drain of the second NMOS transistor and the input pad.

3. A semiconductor integrated circuit device, comprising:

a control signal generating portion for generating an on-die termination control signal in response to a command applied from an external portion; and an on-die termination circuit including a level shifter for boosting the on-die termination control signal to a boosted high voltage level control signal, a power voltage source, a pad, and a first NMOS transistor connected between the power voltage source and the pad, the NMOS transistor being controlled by the boosted high voltage level control signal, wherein the on-die termination circuit further includes a second NMOS transistor connected between ground voltage and the pad, and the pad is terminated to a particular termination voltage level when the first NMOS transistor and the second NMOS transistor are simultaneously activated.

4. The device of claim 3, wherein the first NMOS transistor has a source, the second NMOS transistor has a drain, and the on-die termination circuit further includes:

a first termination resistor connected between the source of the first NMOS transistor and the pad; and a second termination resistor connected between the drain of the second NMOS transistor and the pad.

* * * * *

UNITED STATES PATENT AND TRADEMARK OFFICE
CERTIFICATE OF CORRECTION

PATENT NO. : 7,459,929 B2  Page 1 of 1
APPLICATION NO. : 11/075470
DATED : December 2, 2008
INVENTOR(S) : In-Young Chung It is certified that error appears in the above-identified patent and that said Letters Patent is hereby corrected as shown below:

Column 3, line 10, the word "FIG." should read -- FIG. 2 --;
Column 3, line 12, the word "NI" should read -- N1 --;
Column 5, line 64, the word "corn" should read -- com --.

Signed and Sealed this

Twenty-fourth Day of March, 2009

JOHN DOLL
*Acting Director of the United States Patent and Trademark Office*